(12) United States Patent
Lee

(10) Patent No.: US 7,211,488 B2
(45) Date of Patent: May 1, 2007

(54) METHOD OF FORMING INTER-DIELECTRIC LAYER IN SEMICONDUCTOR DEVICE

(75) Inventor: Ga Won Lee, Kyungki-Do (KR)

(73) Assignee: Hynix Semiconductor Inc., Kyungkido (KR)

( * ) Notice: Subject to any disclaimer, the term of this patent is extended or adjusted under 35 U.S.C. 154(b) by 222 days.

(21) Appl. No.: 10/811,152

(22) Filed: Mar. 29, 2004

(65) Prior Publication Data

US 2004/0185658 A1    Sep. 23, 2004

Related U.S. Application Data

(62) Division of application No. 10/028,972, filed on Dec. 28, 2001, now abandoned.

(30) Foreign Application Priority Data

Jun. 26, 2001 (KR) .............................. 2001-36731

(51) Int. Cl.
*H01L 21/8234* (2006.01)
(52) U.S. Cl. .............................. 438/275; 257/E21.614
(58) Field of Classification Search ................ 438/176, 438/478, 201–203, 206–211, 337, 353, 378, 438/401, 410, 184, 193, 195, 5–7, 10–11, 438/104, 106–114, 118, 141–123, 128, 129, 438/135, 142, 145, 149, 151, 157
See application file for complete search history.

(56) References Cited

U.S. PATENT DOCUMENTS

| | | | |
|---|---|---|---|
| 5,723,381 A * | 3/1998 | Grewal et al. .............. | 438/633 |
| 5,728,595 A | 3/1998 | Fukase | |
| 6,228,756 B1 * | 5/2001 | Lee .............................. | 438/619 |
| 6,287,914 B1 | 9/2001 | Uchiyama et al. | |
| 6,306,759 B1 | 10/2001 | Yen et al. | |
| 6,306,760 B1 | 10/2001 | Hsu et al. | |
| 6,350,650 B1 | 2/2002 | Lee | |
| 6,350,665 B1 * | 2/2002 | Jin et al. .................... | 438/585 |
| 6,352,896 B1 | 3/2002 | Liu et al. | |
| 6,387,759 B1 * | 5/2002 | Park et al. .................. | 438/275 |
| 6,406,987 B1 * | 6/2002 | Huang ........................ | 438/595 |
| 6,551,894 B1 | 4/2003 | Kohyama et al. | |
| 6,753,252 B2 * | 6/2004 | Park et al. .................. | 438/672 |
| 6,821,872 B1 * | 11/2004 | Liao et al. .................. | 438/586 |
| 2001/0054764 A1 * | 12/2001 | Nitta et al. ................. | 257/750 |
| 2002/0173094 A1 * | 11/2002 | Park et al. .................. | 438/241 |

* cited by examiner

*Primary Examiner*—Michael Lebentritt
*Assistant Examiner*—Andre' Stevenson
(74) *Attorney, Agent, or Firm*—Lowe Hauptman & Berner LLP

(57) ABSTRACT

The present invention relates to a method of forming an interlayer dielectric film in a semiconductor device. More particularly, the present invention selectively forms an insulating film spacer only at a region where a plug is formed between metal lines and removes the insulating film spacer at a region where the plug is not formed to lower the aspect ratio between the metal lines, in a process of burying an insulating material between the metal lines to electrically insulate them. Therefore, the present invention can easily bury the insulating material even between the metal lines having a narrow gap without voids.

12 Claims, 6 Drawing Sheets

METHOD OF FORMING INTER-DIELECTRIC LAYER IN SEMICONDUCTOR DEVICE

This is a divisional application of application Ser. No. 10/028,972 filed on Dec. 28, 2001 now abandoned, which is incorporated by reference herein in its entirety.

BACKGROUND OF THE INVENTION

1. Field of the Invention

The invention relates generally to a method of forming an interlayer dielectric film in a semiconductor device, and more particularly to, a method of forming an interlayer dielectric film in a semiconductor device capable of easily burying an insulating material even between metal lines having a narrow gap without voids, in a process of burying the insulating material between the metal lines in order to electrically insulate them.

2. Description of the Prior Art

As a next-generation DRAM is developed, the length of a MOSFET channel used is significantly reduced and the minimum pitch size of word lines and bit lines is also gradually reduced. In a multi-layer metal structure system such as DRAM, further, a method by an insulating spacer is formed on the sidewall of a metal line using nitride or oxide in order to insulate the metal line and a metal plug, has been widely used, which further reduces the distance between the metal lines. In this case, upon deposition of IMD (inter metal dielectric), a gap filling comes to the front as a serious problem.

FIG. 1 shows a layout of a general 8F2 DRAM after the word lines and the bit lines are formed, FIGS. 2A~2C are cross-sectional views of the device taken along lines A–A', B–B' and C–C' in FIG. 1, and FIGS. 3A~3C are cross-sectional views of the device taken along lines A–A', B–B' and C–C' in FIG. 1.

Referring now to FIG. 1, FIGS. 2A~2C and FIGS. 3A~3C, a word line 13, a word line spacer 14, a first interlayer dielectric film 15, a bit line plug 16, bit lines 17, bit line spacers 18, second interlayer dielectric films 19 and a contact plug 20 are sequentially formed on a semiconductor substrate 11 in which a device isolation film 12 is formed, through a common process.

As mentioned above, in a multi-layer metal structure system such as DRAM, a method of a formation of an insulating spacer (word line spacer or bit line spacer) on the sidewall of a metal line using nitride or oxide has been widely used in order to insulate the metal lines (bit lines or word lines) and a metal plug (bit line plug or contact plug), which thus requires a higher intergeration of the device and further reduces the distance between the metal lines.

FIGS. 4A and 4B are cross-sectional views of the device for explaining a gap filling problem depending on an increased aspect ratio;

Referring to FIG. 1 and FIG. 4A, in order to manufacture a DRAM, a word line 13, a word line spacer 14, a first interlayer dielectric film 15, a bit line plug 16, bit lines 17 and bit line spacers 18 are formed on a semiconductor substrate 11 in which a device isolation film 12 is formed, through a common process.

At this time, the distance "W" between the bit lines 17 is reduced by the width "L" of the bit line spacer, so that an actual distance "W'" between the bit lines is "W-2L".

Referring to FIGS. 1 and 4B, with the bit lines 17 and the bit line spacer 18 formed, a second interlayer dielectric film 19 is formed on the entire surface for an electrical insulation with upper elements.

At this time, as the aspect ratio between the bit lines 17 is increased by the bit line spacer 18 and the speed where the second interlayer dielectric films 19 are formed below between the bit lines 17 is therefore further faster than that where the second interlayer dielectric films 19 are formed over the bit lines 17, voids A are generated below between the bit lines 17. This degrades an electrical characteristic of the device and reliability of the process.

SUMMARY OF THE INVENTION

The present invention is contrived to solve the above problems and an object of the present invention is to provide a method of forming an interlayer dielectric film in a semiconductor device, which can improve a burial characteristic between metal lines, in a way that an insulating film spacer is selectively formed only at a region where a plug is formed between the metal lines and the insulating film spacer at a region where the plug is not formed is removed to lower the aspect ratio between the metal lines.

In order to accomplish the above object, a method of forming an interlayer dielectric film in a semiconductor device according to a first embodiment of the present invention is characterized in that it comprises the steps of forming conductive layer patterns of a given pattern and an insulating film spacer on the sidewalls of the conductive layer patterns through a common process; removing the insulating film spacer formed in a region other than a region where a contact plug will be formed; and forming an interlayer dielectric film on the entire surface.

A method of forming an interlayer dielectric film in a semiconductor device according to a second embodiment of the present invention is characterized in that it comprises the steps of forming conductive layer patterns of a given pattern through a common process; forming an interlayer dielectric film on the entire surface; and removing the interlayer dielectric film at a region where a contact plug will be formed and then forming an insulating film spacer on the sidewall of the conductive layer patterns.

A method of forming an interlayer dielectric film in a semiconductor device according to a third embodiment of the present invention is characterized in that it comprises the steps of forming conductive layer patterns of a given pattern and an insulating film spacer on the sidewall of the conductive layer patterns through a common process; burying a conductive material between the conductive layer patterns; removing the conductive material only at a given region and remaining the conductive material at remaining regions to form a contact plug; and burying an interlayer dielectric film between the conductive layer patterns at a region from which the conductive material is removed.

In the above, the conductive layer patterns may be word lines or bit lines.

BRIEF DESCRIPTION OF THE DRAWINGS

The aforementioned aspects and other features of the present invention will be explained in the following description, taken in conjunction with the accompanying drawings, wherein.

DETAILED DESCRIPTION OF PREFERRED EMBODIMENTS

The present invention will be described in detail by way of a preferred embodiment with reference to accompanying drawings.

Figure 1:
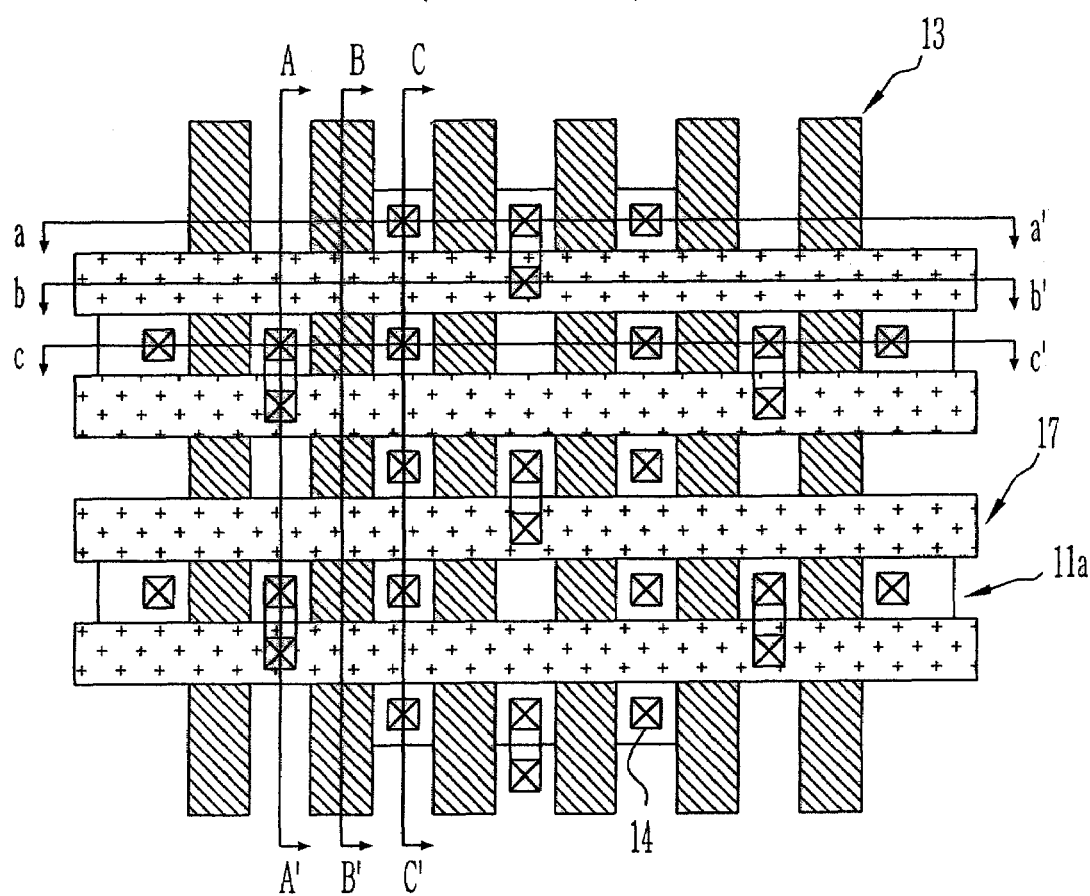
FIG. 1 shows a layout of a general DRAM device.
Figure 2A:
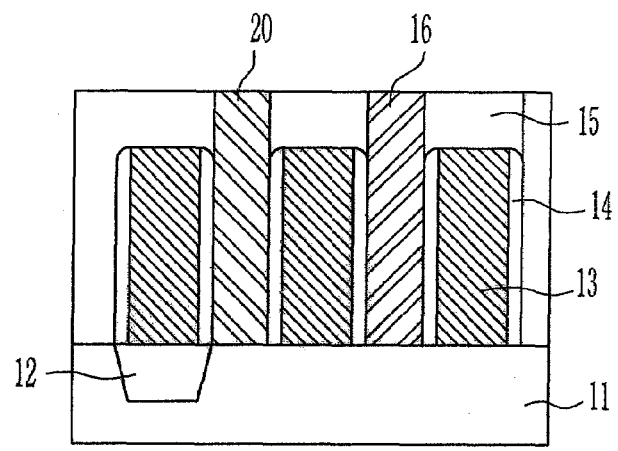
FIGS. 2A~2C are cross-sectional views of the device taken along lines A–A', B–B' and C–C' in FIG. 1.
Figure 2B:
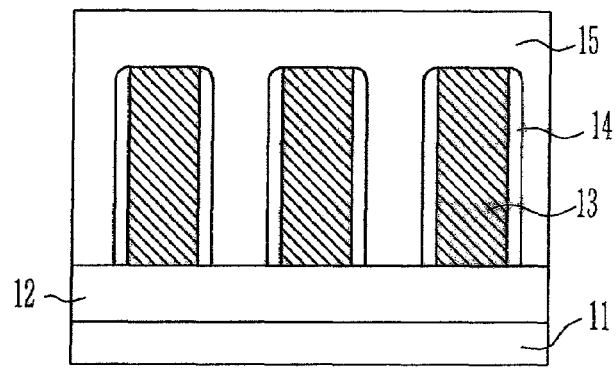
Figure 2C:
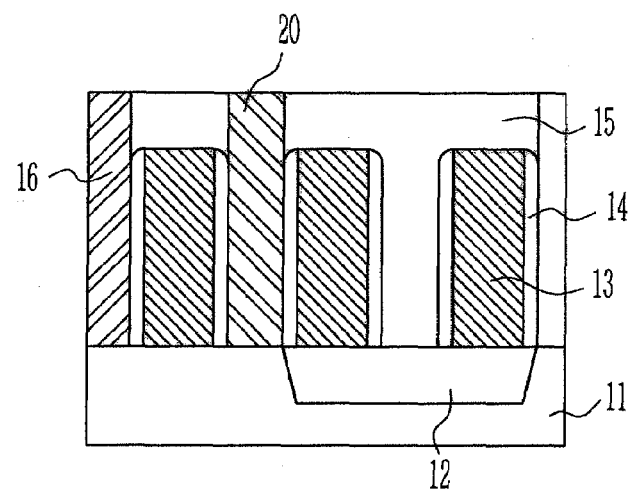
Figure 3A:
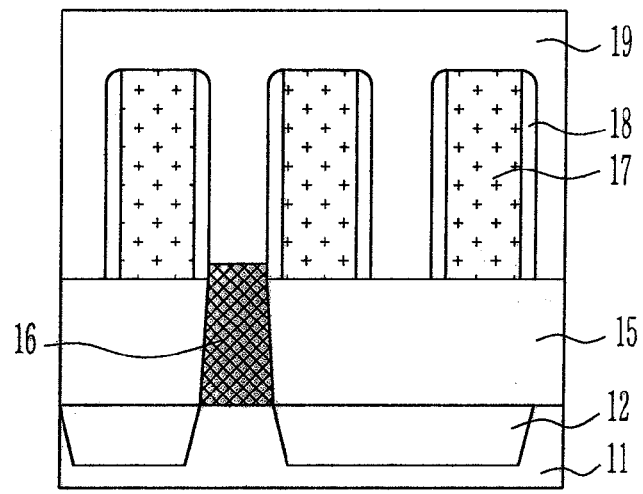
FIGS. 3A~3C are cross-sectional views of the device taken along lines A–A', B–B' and C–C' in FIG. 1.
Figure 3B:
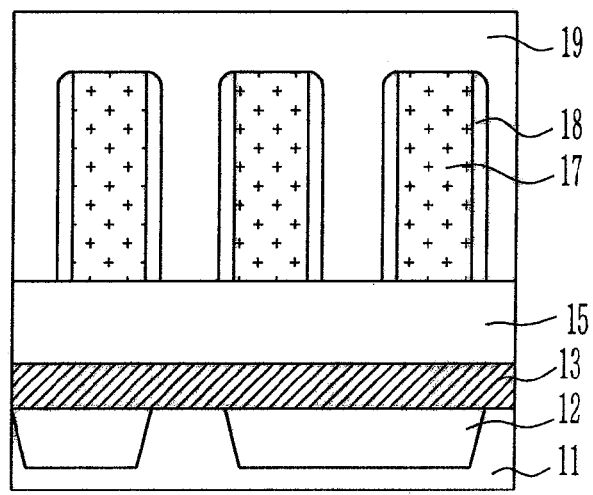
Figure 3C:
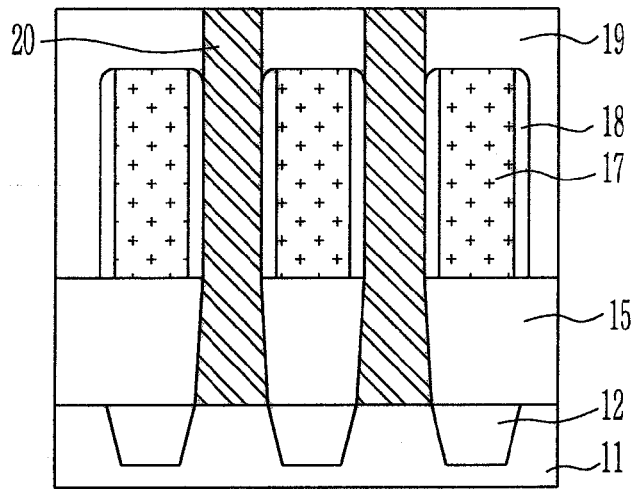
Figure 4A:
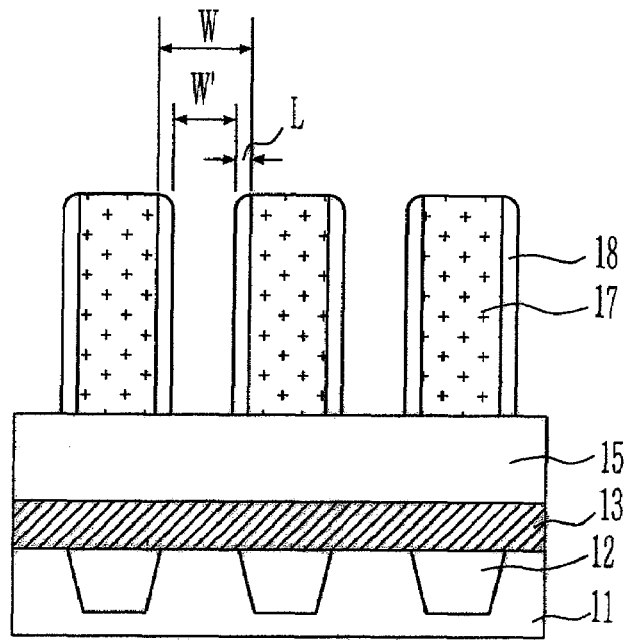
FIGS. 4A and 4B are cross-sectional views of the device for explaining a gap filling problem depending on an increased aspect ratio.
Figure 4B:
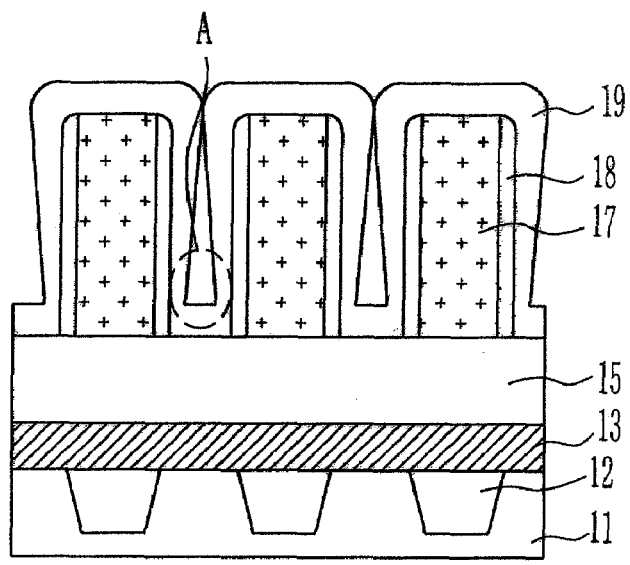
Figure 5A:
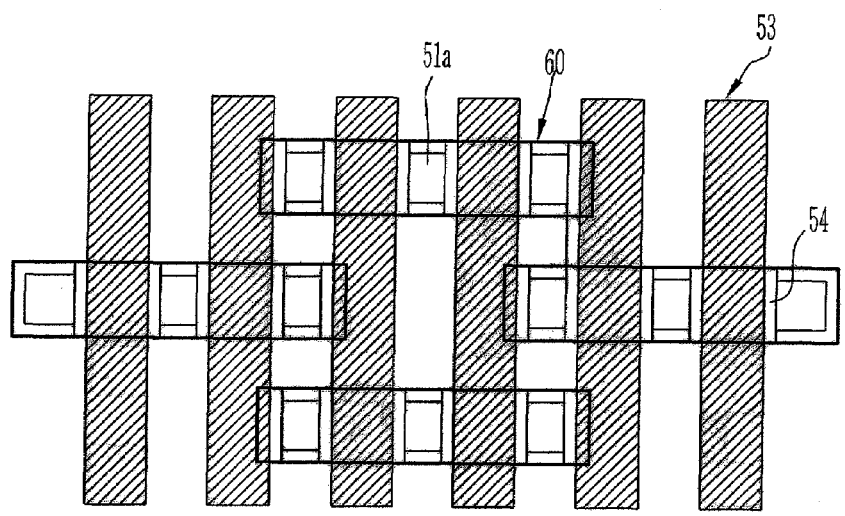
FIGS. 5A and 5B show layouts for explaining a method of forming an interlayer dielectric film in a semiconductor device according to one embodiment of the present invention.
Figure 5B:
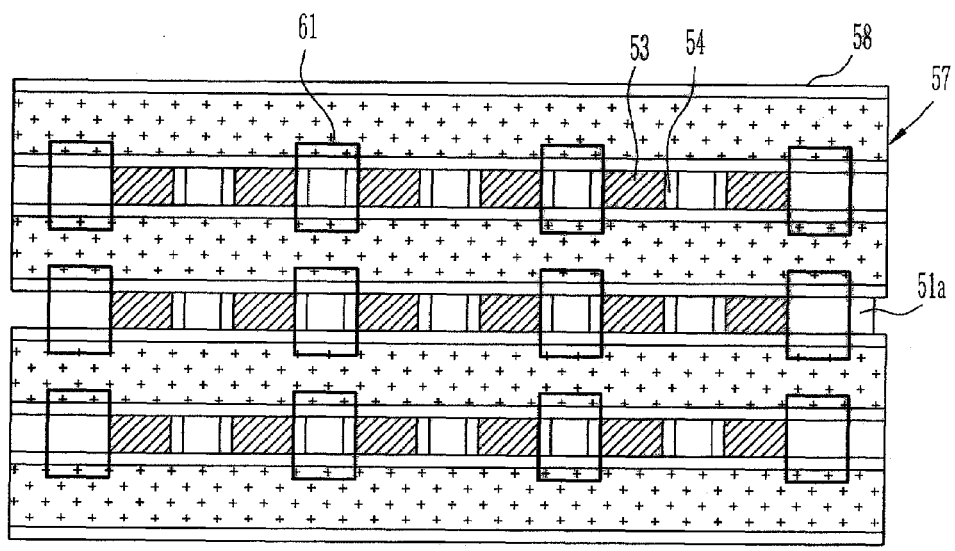

FIGS. 5A and 5B show layouts for explaining a method of forming an interlayer dielectric film in a semiconductor device according to one embodiment of the present invention.

Referring now to FIG. 5A, a device isolation film (not shown), a junction region 51a, word lines 53 and a word line spacer 54 are formed on a semiconductor substrate through a common process. Then, a first photoresist pattern 60 is formed at a region wherein a contact plug will be formed, for the purpose of an electrical insulation with upper elements including a capacitor to be formed in a subsequent process. The first photoresist pattern 60 is formed to sufficiently cover the word line spacer 54 in a region where a contact plug will be formed. Thereafter, an exposed portion of the word line spacer 54 is removed by etch process. Thereby, the word line spacer 54 remains on the sidewall of the word lines 53, with the contact plug and the word lines 53 having a margin that will not be electrically connected together at a region where the contact plug will be formed. Next, a first interlayer dielectric film (not shown) is formed on the entire surface in order to electrically insulate the word lines 53 and bit lines that will be formed in a subsequent process. The word line spacer is removed from remaining regions other than a region that the contact plug will be formed so that the distance between the word lines 53 can be sufficiently secured to lower the aspect ratio. Therefore, the first interlayer dielectric film can be easily buried between the word lines 53 without any voids. As the first interlayer dielectric film must be removed from the region where the word line spacer 54 remains in order to form the contact plug in a subsequent process, there is no problem even when voids are generated in the first interlayer dielectric film in this region. After the word line spacer is removed, the first photoresist pattern 60 is removed.

Referring now to FIG. 5B, a bit line plug (formed below the bit line, not shown), bit lines 57 and a bit line spacer 58 are sequentially formed at a given region on the first interlayer dielectric film (not shown) formed on the entire surface, through a common process. For the purpose of an electrical isolation with upper elements including a capacitor to be formed in a subsequent process, a second photoresist pattern 61 is formed at a region where the contact plug will be formed. The second photoresist pattern 61 is formed to sufficiently cover the bit line spacer 58 in the region where the contact plug will be formed. The exposed bit line spacer 58 is then removed by etch process. Thereby, the bit line spacer 58 remains on the sidewall of the bit lines 57, with the contact plug and the bit lines 57 having a margin that will not be electrically connected together at a region where the contact plug will be formed. Next, a second interlayer dielectric film (not shown) is formed on the entire surface in order to electrically insulate the bit lines 57 and upper elements including a capacitor that will be formed in a subsequent process. The bit line spacer is removed from remaining regions other than a region that the contact plug will be formed, so that the distance between the bit lines 57 can be sufficiently secured to lower the aspect ratio. Therefore, the second interlayer dielectric film can be easily buried between the bit lines 57 without any voids. Similarly, as the second interlayer dielectric film must be removed from the region where the bit line spacer 58 remains in order to form the contact plug in a subsequent process, there is no problem even when voids are generated in the second interlayer dielectric film in this region. After the bit line spacer is removed, the second photoresist pattern 61 is removed.

Thereafter, though not shown in the drawings, the second and first interlayer dielectric films are removed to expose the junction region of the semiconductor substrate. Then, a conductive material is buried to form the contact plug and upper elements including the capacitor are formed through a common process.

The above process forms an insulating film spacer at the sidewall of the word lines or the bit lines, removing the insulating film spacer in a region where the plug is not formed and buries the interlayer dielectric film, thus securing the distance between the word lines or the bit lines to improve a burial characteristic of the interlayer dielectric film.

Also, another embodiment for securing the distance between the word lines or the bit lines by removing an insulating film spacer in a region where the plug is not formed will be below explained.

After the word lines or the bit lines are formed through a common process, an interlayer dielectric film is completely buried between the word lines or the bit lines before an insulating film spacer is formed. At this time, as the distance between the word lines or the bit lines is sufficiently secured since the insulating film spacer is not formed, between the word lines or the bit lines can be easily buried using the interlayer dielectric film without voids. Thereafter, after only an interlayer dielectric film in a region where the plug will be formed is removed, an insulating film spacer is formed on the sidewall of the word lines or the bit lines, which is exposed by the removed interlayer dielectric film.

In addition, still another embodiment for securing the distance between the word lines or the bit lines by removing an insulating film spacer in a region where the plug is not formed will be below explained.

Figure 6A:
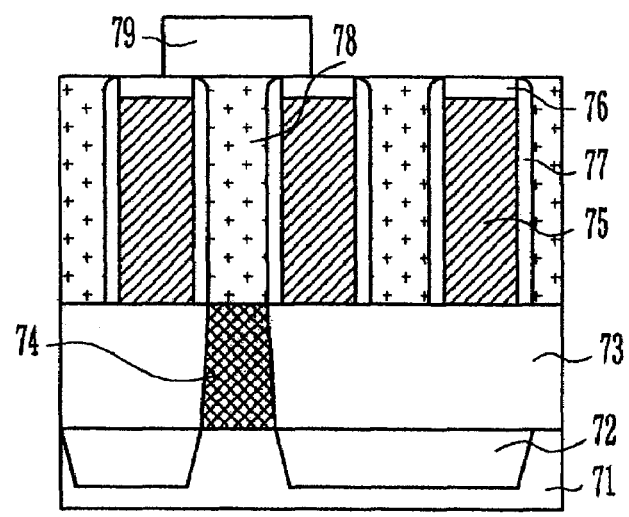
FIGS. 6A~6C are cross-sectional views of a device for explaining a method of forming an interlayer dielectric film in a semiconductor device according to another embodiment of the present invention.
Figure 6B:
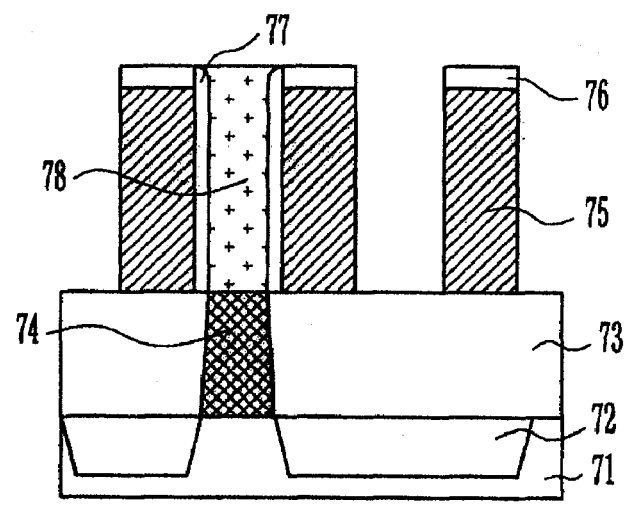
Figure 6C:
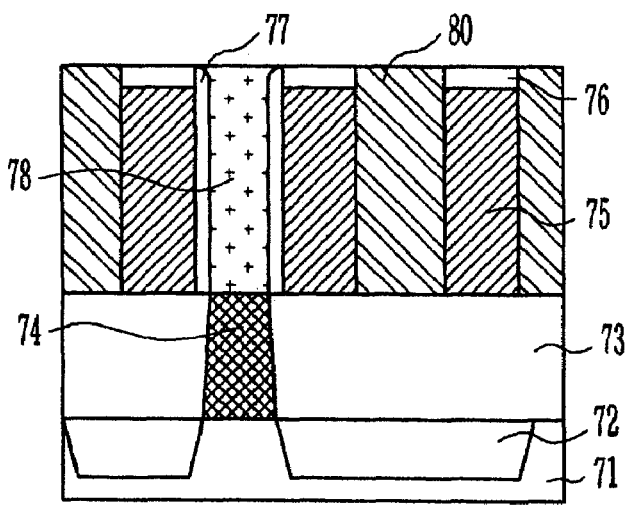

FIGS. 6A~6C are cross-sectional views of a device for explaining a method of forming an interlayer dielectric film in a semiconductor device according to another embodiment of the present invention.

Referring now to FIG. 6A, word lines (not shown), a word line spacer (not shown) and a junction region (not shown) are formed on a semiconductor substrate 71 in which a device isolation region 72 is formed at a given region, through a common process. Then, a first interlayer dielectric film 73 is formed on the entire surface. After the first interlayer dielectric film 73 on the junction region is removed by etch process, a conductive material is buried into a region from which the first interlayer dielectric film 73 is removed to form a first contact plug 74, in order to electrically connected the junction region and upper elements to be formed in a subsequent process. Next, insulating films of a given pattern such as bit lines 75 and a nitride film 76 are sequentially formed on the first interlayer dielectric film 73 and an insulating film spacer 77 is then formed on the sidewall of the bit line 75 and the nitride film 76. At this time, an upper surface of the first contact plug 74 is exposed between the bit lines 75. Then, after polysilicon or a conductive material is formed on the entire surface, polysilicon or the conductive material on the nitride film is removed by means of planarization process, so that it remains only between the bit lines 75, thus forming a second contact plug 78. If the second contact plug 78 is formed between the bit lines 75, a photoresist pattern 79 of a given pattern is formed on the entire surface to expose only an unnecessary portion of the second contact plug.

Referring now to FIG. 6B, the unnecessary portion of the second contact plug is removed by etching process and the exposed insulating film spacer 77 between the bit lines 75 is removed while the second contact plug is removed. Then, the photoresist pattern is removed.

Thereby, the second and first contact plugs 78 and 74 electrically connect an upper element such as a capacitor, etc., that will be formed in a subsequent process, to the junction region.

Referring now to FIG. 6C, a second interlayer dielectric film 80 is formed on the entire surface. Then, a planarization process such as chemical mechanical polishing process, and the like is implemented to bury the second interlayer dielectric film 80 between the bit lines 75 from which the second contact plug and the insulating film spacer are moved to electrically isolate the bit lines 75.

The insulating film spacer is removed from between the bit lines 75 in which the second interlayer dielectric film 80 is buried, thus lowering the aspect ratio. Therefore, the second interlayer dielectric film 80 can be easily buried without voids.

Though the above methods can easily bury an insulating material between word lines or bit lines having a narrow width in a memory device, they can also easily bury the insulating film between metal lines or patterns having a narrow width.

As mentioned above, the present invention can easily bury an insulating material between metal lines without voids by selectively forming an insulating film spacer only at a given region. Therefore, the present invention has an advantage that it can improve reliability of the process and an electrical characteristic of the device.

The present invention has been described with reference to a particular embodiment in connection with a particular application. Those having ordinary skill in the art and access to the teachings of the present invention will recognize additional modifications and applications within the scope thereof.

It is therefore intended by the appended claims to cover any and all such applications, modifications, and embodiments within the scope of the present invention.

What is claimed is:

1. A method of forming an interlayer dielectric film in a semiconductor device, the method comprising:
    forming conductive layer pattern on a semiconductor substrate including a junction region and an isolation region;
    forming insulating film spacers on sidewalls of said conductive layer pattern to expose the junction region;
    burying a conductive material between said insulating film spacers;
    removing said conductive material and said insulating film spacers in the isolation region; and
    forming an interlayer dielectric film on an entire surface of the semiconductor device so that the interlayer dielectric film is buried between the conductive layer pattern in the isolation region.

2. The method of according to claim 1, wherein said conductive layer pattern includes a word line or a bit line.

3. A method of forming an interlayer dielectric film in a semiconductor device, the method comprising:
    forming conductive layer patterns and an insulating film spacers on sidewalls of said conductive layer patterns on a semiconductor substrate to expose a first contact plug;
    forming a conductive material on the entire surface to bury the conductive material between said insulating film spacers;
    removing said conductive material and the insulating film spacers at a removal region such that said conductive material remains on the first contact plug to form a second contact plug and the insulating film spacers only remain at both sides of the second contact plug; and
    burying an interlayer dielectric film between said conductive layer patterns at said removal region.

4. The method according to claim 3, wherein said conductive layer pattern includes a bit line.

5. A method of forming an interlayer dielectric film in a semiconductor device, the method comprising:
    forming first conductive layer patterns on a semiconductor substrate including a junction region and an isolation region;
    forming first spacers on sidewalls of the first conductive layer patterns;
    removing the first spacers on the isolation region;
    forming a first interlayer dielectric film on the entire surface;
    forming a first contact hole by patterning the first interlayer dielectric film to expose the junction region;
    forming a first contact plug by burying a first conductive material in the first contact hole;
    forming second conductive layer patterns on the entire surface including the first contact plug;
    forming second spacers on sidewalls of the second conductive layer patterns;
    forming a second conductive material on the entire surface to bury the second conductive material between the second conductive patterns;
    forming a second contact plug by remaining the second conductive material on the first contact plug and removing the second conductive material and the second spacers on the first interlayer dielectric film, wherein the second spacers remains at both side of the second contact plug; and
    forming a second interlayer dielectric film on the entire surface;

6. The method according to claim 5, wherein the first conductive layer patterns comprises a word line.

7. The method according to claim 5, wherein the second conductive layer patterns comprises a bit line.

8. The method according to claim 5, wherein the second conductive material includes a polysilicon.

9. The method according to claim 5, wherein the second conductive layer patterns further includes nitride film.

10. The method according to claim 5, the method further comprising:
    performing a first planarization process to remove the second conductive material on the second conductive patterns after forming the second conductive material.

11. The method according to claim 5, the method further comprising:
    performing a second planarization process after forming the second interlayer dielectric film on the entire surface.

12. The method according to claim 5, wherein the first spacers is remained at both side of the first contact plug.

* * * * *